United States Patent [19]
Stellrecht

[11] 3,947,866
[45] Mar. 30, 1976

[54] ION IMPLANTED RESISTOR HAVING CONTROLLED TEMPERATURE COEFFICIENT AND METHOD

[75] Inventor: Hans H. Stellrecht, San Jose, Calif.

[73] Assignee: Signetics Corporation, Sunnyvale, Calif.

[22] Filed: May 31, 1974

[21] Appl. No.: 475,128

Related U.S. Application Data
[63] Continuation-in-part of Ser. No. 373,458, June 25, 1973, abandoned.

[52] U.S. Cl. .................. 357/51; 357/91; 357/88; 357/40; 338/35
[51] Int. Cl.² ................................. H01L 27/02
[58] Field of Search ............ 357/40, 91, 51, 88; 338/35

[56] References Cited
UNITED STATES PATENTS

| | | | |
|---|---|---|---|
| 3,387,193 | 6/1968 | Donald | 357/40 |
| 3,548,269 | 12/1970 | MacDougall et al. | 357/91 |
| 3,578,514 | 5/1971 | Lesk | 357/40 |
| 3,596,347 | 8/1971 | Beale | 357/40 |
| 3,629,782 | 12/1971 | Sahni | 357/40 |
| 3,683,306 | 8/1972 | Bulthuis et al. | 357/91 |
| 3,697,827 | 10/1972 | Simon | 357/91 |
| 3,725,136 | 4/1973 | Morgan | 357/91 |
| 3,739,237 | 6/1973 | Shannon | 357/91 |
| 3,796,929 | 3/1974 | Nicholas et al. | 357/91 |
| 3,829,890 | 8/1974 | Perloff et al. | 357/91 |

OTHER PUBLICATIONS

*Masking Technique for Ion Implantation,* by Fairfield, IBM Technical Disclosure Bulletin, Vol. 13, No. 3, Aug. 1970, p. 806.
*Trimming of Ion Implanted Resistor,* by Wilbarg, IBM Technical Disclosure Bulletin, Vol. 13, No. 6, Nov. 1970, p. 1698.

Primary Examiner—Andrew J. James
Attorney, Agent, or Firm—Flehr, Hohbach, Test, Albritton & Herbert

[57] ABSTRACT

Ion implanted resistor having a semiconductor body of one conductivity type and having a planar surface with a region of opposite conductivity type formed in the semiconductor body which is defined by a PN junction extending to the surface. One portion of the region of opposite conductivity type in cross-section has a greater depth than the remaining portion whereby there is provided a resistance whose effective value is the value given by the parallel resistance of said one portion and the remaining portion to thereby provide a resistor having a controlled temperature coefficient.

7 Claims, 11 Drawing Figures

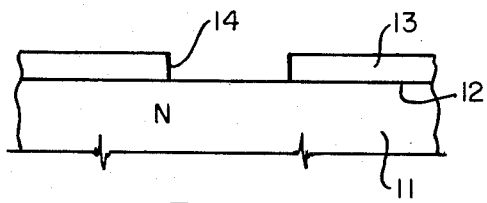
FIG. 1
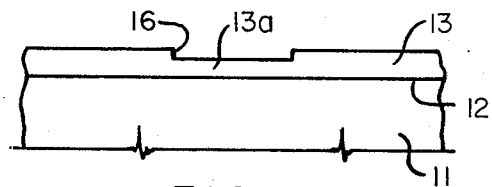
FIG. 2
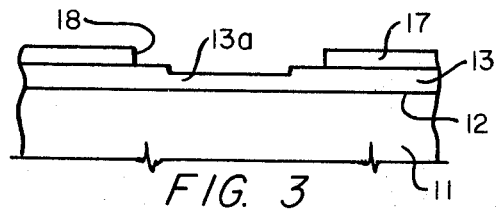
FIG. 3
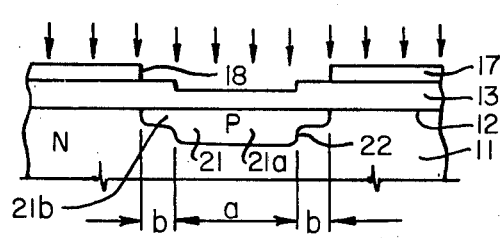
FIG. 4
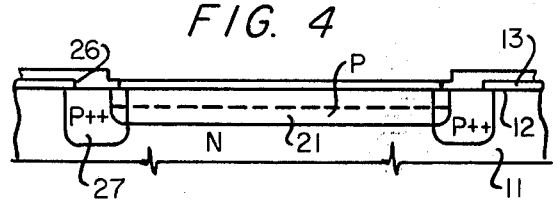
FIG. 5
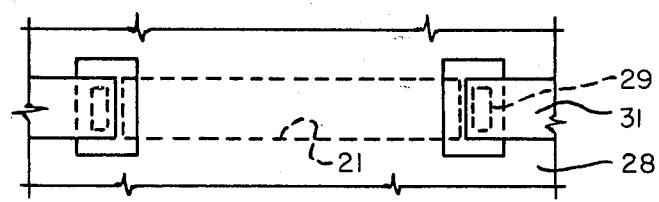
FIG. 7
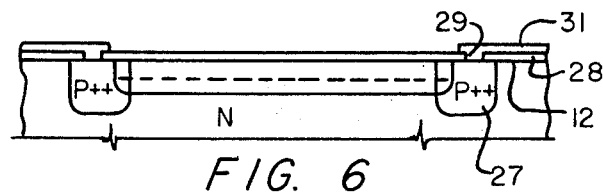
FIG. 6
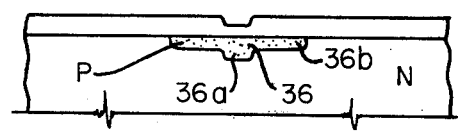
FIG. 8 POS. T.C.
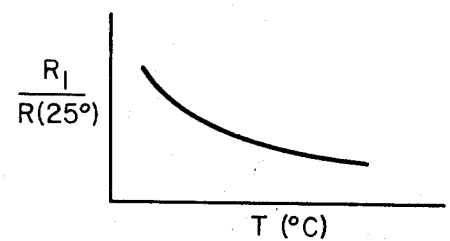
FIG. 11
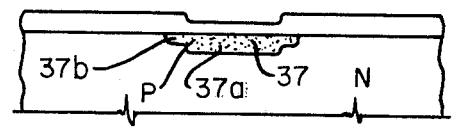
FIG. 10 NEG. T.C.
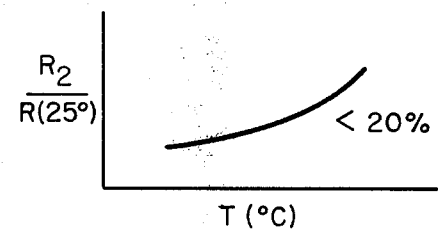
FIG. 9

3,947,866

ION IMPLANTED RESISTOR HAVING CONTROLLED TEMPERATURE COEFFICIENT AND METHOD

CROSS-REFERENCE TO RELATED APPLICATIONS

This application is a continuation-in-part of application Ser. No. 373,458 filed June 25, 1973 now abandoned.

BACKGROUND OF THE INVENTION

Ion implanted resistors have heretofore been provided but in such resistors it has been very difficult to provide a resistor whose temperature coefficient was not dependent upon a number of conditions as, for example, the implantation dose, the anneal temperature and perhaps even the energy of implantation. In such prior art processes, it has been possible to obtain a negative temperature coefficient of approximately 5% to a positive temperature coefficient of possibly up to 20%. In addition, with such prior art processes, it has not been possible to provide two different resistors with two different temperature coefficients on the same die in the same circuit. There is, therefore, a need for a new and improved ion implanted resistor and a method for making the same.

SUMMARY OF THE INVENTION AND OBJECTS

The ion implanted resistor having a controlled temperature coefficient is comprised of a semiconductor body of one conductivity type and having a planar surface. A region of opposite conductivity type is formed in the body and is defined by a PN junction extending to the surface. One portion of said region of opposite conductivity in cross-section having a greater depth than the remaining portion of the region of opposite conductivity whereby there is provided a value of resistance whose effective value is the value given by the parallel resistance of said one portion and the remaining portion to provide a resistor having a controlled temperature coefficient.

In general, it is an object of the present invention to provide an ion implanted resistor having a controlled temperature coefficient and a method for making the same.

Another object of the invention is to provide a resistor and method of the above character applicable to integrated circuits.

Another object of the invention is to provide a resistor and method of the above character in which it is possible to provide two resistors with different temperature coefficients on the same chip or die.

Another object of the invention is to provide a resistor and method of the above character in which the resistor has an increased voltage capability.

Additional objects and features of the invention will appear from the following description in which the preferred embodiments are set forth in detail in conjunction with the accompanying drawings.

BRIEF DESCRIPTION OF THE DRAWINGS

FIGS. 1–6 are cross-sectional views showing the steps in the process or method for making the ion implanted resistor.

FIG. 7 is a plan view of the completed ion implanted resistor shown in FIG. 6.

FIGS. 8 and 10 are cross-sectional views showing alternative embodiments of the invention.

FIGS. 9 and 11 are graphs showing the temperature coefficients of the embodiments of the invention shown in FIGs. 8 and 10, respectively.

DESCRIPTION OF THE PREFERRED EMBODIMENTS

The ion implanted resistor incorporating the present invention is fabricated by taking a semiconductor body 11 which can be in wafer form of one conductivity type as, for example, N conductivity type having a resistivity of 5 ohm cm. The semiconductor body can be formed of a suitable semiconductor such as silicon. The semiconductor body 11 is provided with a planar surface 12 upon which there is formed a layer 13 of an insulating material as, for example, silicon dioxide, to a suitable thickness such as 2000 Angstroms. By way of example, the insulating layer 13 can be formed of a thermally grown oxide which can be produced in a manner well known to those skilled in the art.

An opening or hole 14 is provided in the insulating layer 13 conventional photolithographic techniques to expose an area of the surface 12. The opening 14 can have any desired geometry as, for example, rectangular. For reasons hereinafter explained, it is desirable that the opening 14 have a size which is larger than the first ion implanted mask as hereinafter described. A thermally grown layer 13a of silicon dioxide is then formed in the opening 14 to a suitable depth as, for example, 2000 Angstroms. At the same time, the depth of the remaining portions of the insulating layer 13 increases so that there still remains a recess 16 in the oxide layer 13 which is in registration with the opening 14.

Means is then provided for forming a mask 17 on the surface of the insulating layer 13. The mask can be formed of any suitable material such as of a photoresist or aluminum. If aluminum is utilized, the aluminum can be evaporated onto the surface 17. Typically, the thick oxide layer 13 can have a thickness of approximately 3500 Angstroms, the thin layer 13a can have a thickness of approximately 1500 Angstroms, and the aluminum layer 17 can have a thickness of approximately 1 micron.

A region 21 of opposite conductivity is then formed in the semiconductor body and is defined by a PN junction 22 extending to the surface 12. The region of P type impurity is formed by ion implantation as shown in FIG. 4 by implanting boron to provide a dose of approximately $1 \times 10^{15}$ impurities per cubic cm. An ion implantation energy of 75 kev was utilized. However, energies ranging from 50 kev to 200 kev can be utilized if desired. The structure shown in FIg. 4 was annealed at a temperature of 600°C. for a period of 20 minutes. An annealing temperature ranging from 400°C. to 950°C. for a period of 1 minute to several hours can be utilized if desired.

From FIG. 4 it can be seen that the region 21 in cross-section varies in depth. As hereinafter pointed out, the temperature behavior of the semiconductor structure is dependent upon the depth of the ion implanted region 21. By way of example, one portion 21a having a width in cross-section designated by the letter $a$ has a significantly greater depth as, for example, 1 micron than the depth of the other remaining portion 21b of the region 21 and having a width indicated by the letter $b$ and having a depth of approximately onehalf micron. The effective combined resistance of the region 21 is given by the parallel resistance of the portion 21a and the portion 21b. The portion 21a, because of its greater depth, will have a lower temperature coefficient than the shallower portion 21b. Generally, the relative difference in temperature coefficient of these two portions is determined by the differences in depth of the two portions although there are other factors which have some effect upon the temperature coefficient.

The region 21 in cross-section having varying depths is obtained by implanting through different thicknesses of oxide masks as shown. Thus, the region of greatest depth is obtained where the oxide layer 13a is the thinnest, the other portion of the region 21 having a shallower depth is obtained because the ions must travel through a thicker oxide layer 13. The aluminum layer 17 serves to prevent ions from being implanted below the aluminum layer.

Prior to ion implantation, a suitable impurity such as boron is diffused through the openings (not shown) to form P+ contact regions 27 which extend into the semiconductor body 11 from the surface 12 to provide P++ contact regions 27 which are positioned so that the extremities of the region 21 come into contact with the regions 27 when the region 21 is thereafter formed as shown in FIG. 5 which is a cross-setional view at right angles to the views shown in FIGS. 1–4. After ion implantation and annealing have been carried out, the aluminum layer 17 can be removed. Similarly, the oxide layer 13 can be removed to thereby strip the surface 12.

Thereafter, another oxide layer 28 is grown on the surface 12 as shown in FIG. 6. Constact openings 29 are then formed in the oxide layer 28 which overlie the P+ regions 27. Metallization is then evaporated on the surface of the oxide 28 and then by suitable photolithographic techniques, the undesired metal is removed so that there remains metal leads 31 which are adherent to the oxide layer 28 and which extend through the openings 29 to make contact to the P+ regions 27 at the surface 12 which are at opposite ends of the P+ resistive region 21 to provide a completed resistor.

It should be appreciated that in conjunction with the foregoing the portion of the semiconductor body 12 shown in the drawing is merely a portion of the wafer which is being utilized in the fabrication of the resistor device and that the resistor can be one of a plurality of resistors and, in addition, the resistor can be a part of an integrated circuit comprised of a plurality of active and passive devices as, for example, transistors, diodes and capacitors to provide all the necessary elements for fabricating an integrated circuit.

In making the present invention, it has been found that it is possible to provide a resistor which has a controlled temperature coefficient. Thus, by providing the proper ratio of deeper regions to shallow regions, it is possible to provide a resistor having an effective zero TC. The specific value of the resistance is primarily determined by the geometry of the resistor as well as the annealing conditions utilized. By annealing at lower or higher temperatures, it is possible to obtain a relatively wide variation of resistance values. The annealing temperature will also have some effect upon the temperature coefficient and generally the temperature coefficient will increase with an increasing anneal temperature. With the present invention, it is possible to provide two resistors in the same chip while giving each resistor its own temperature coefficient. Alternatively, it is often desirable to have two resistors which have the same temperature coefficient so that they will track each other very accurately.

It also has found that in addition to being able to control the temperature coefficient of the resistor, it is possible to increase the voltage breakdown of the resistor. The increase voltage capability of the resistor is obtained by the fact that the junction curvature of the ion implanted resistor is flattened out to thereby provide a higher breakdown voltage. The junction curvature is the slope of the curve of the portion of the PN junction that extends to the surface. The curved portions have an average slope which is significantly reduced in the present invention. In addition, the curved portions extend over a relatively wide region. Each curved portion has at least one step therein. Thus, the breakdown voltage of a resistor can be increased or decreased depending on the surface concentration and also depending upon the thickness of the ion implanted regions. In certain cases, it may be desirable to provide a resistor having a lower breakdown voltage in parallel with other devices in the integrated circuit as, for example, an amplifier so that in the event of an excess voltage, the resistor would break down to protect the amplifier.

As also pointed out previously, by utilizing the present invention it is possible to obtain negative and positive temperature coefficients. In FIG. 8 there is shown a cross-sectional view of an ion implanted resistor which has a relatively narrow deeper portion 36a of an ion implanted region 36 which is much narrower than the relatively wide shallower portion 36b of the same ion implanted region 36. For this reason, the properties of the shallower region dominate the characteristics of the temperature coefficient and, therefore, a positive temperature coefficient which is shown by the curve in FIG. 9 is obtained. Conversely, in FIG. 10, the deeper region 37a has a much greater width than the shallower region 37b of an ion implanted region 37, and for that reason the characteristics of the deeper region 37a dominate so that there is provided a negative temperature coefficient as shown by the curve in FIG. 11.

It is apparent from the foregoing that there has been provided a new and improved ion implanted resistor having a controlled temperature coefficient and a method for making the same. By the use of ion implantation, it is possible to provide such resistors having temperature coefficients ranging from a negative 5% to approximately a positive 20% temperature coefficient. In addition to being able to control the temperature coefficient, it is found possible to obtain other desirable characteristics as, for example, to control the breakdown voltage of the resistor. In addition, it is possible to provide pairs of resistors in the same die which, if desired, can have the same temperature coefficients so that tracking is obtained or, alternatively, can have different temperature coefficients.

I claim:

1. In a semiconductor structure having an ion implanted resistor formed therein with controlled temperature coefficient, a semiconductor body of one conductivity type and having a planar surface, a region of opposite conductivity type formed in the body by ion implantation and being defined by a PN junction extending to the surface and serving as a resistor, one portion of said region in cross-section having a greater depth than the remaining portion of the region whereby there is provided a resistor having a resistance whose effective value is given by the parallel resistance of said one portion and the remaining portion which has a controlled temperature coefficient.

2. A structure as in claim 1 together with a layer of insulating material on said surface of said body, and leads carried by said layer of insulating material and extending through said layer of insulating material and in contact with said region of opposite conductivity type.

3. A semiconductor structure as in claim 1 wherein said other portion of said region of opposite conductivity type has a width which is greater than the width of the deeper one portion so that said region of opposite conductivity type has a negative temperature coefficient.

4. A semiconductor structure as in claim 1 wherein said other portion of said region of opposite conductivity type has a width which is substantially greater than the width of the deeper one portion so that said region of opposite conductivity tpe has a positive temperature coefficient.

5. A semiconductor structure as in claim 1 wherein said PN junction has curved portions extending to the surface which extend over a relatively wide region to provide greater voltage breakdown capabilities.

6. A semiconductor structure as in claim 5 where said curved portion has steps therein.

7. A semiconductor structure as in claim 2 together with contact regions formed in said semiconductor body and being of the same conductivity type as said region of opposite conductivity type and making contact with said region of opposite conductivity type and wherein said leads make contact with said contact regions.

* * * * *